United States Patent
Moon et al.

(10) Patent No.: US 9,831,902 B2
(45) Date of Patent: Nov. 28, 2017

(54) BLUETOOTH SMART SIGNAL RECEIVING METHOD AND DEVICE USING IMPROVED AUTOMATIC GAIN CONTROL

(71) Applicant: ABOV SEMICONDUCTOR CO., LTD., Cheongju, Chungcheongbuk-Do (KR)

(72) Inventors: Ki Tae Moon, Seoul (KR); Sang Young Chu, Gyeonggi-do (KR); Suk Kyun Hong, Seoul (KR)

(73) Assignee: ABOV SEMICONDUCTOR CO., LTD., Cheongju, Chungcheongbuk-do (KR)

( * ) Notice: Subject to any disclaimer, the term of this patent is extended or adjusted under 35 U.S.C. 154(b) by 0 days.

(21) Appl. No.: 15/390,429

(22) Filed: Dec. 23, 2016

(65) Prior Publication Data

US 2017/0194925 A1    Jul. 6, 2017

(30) Foreign Application Priority Data

Dec. 30, 2015  (KR) .................. 10-2015-0189370

(51) Int. Cl.
| | |
|---|---|
| *H04B 7/00* | (2006.01) |
| *H04B 1/16* | (2006.01) |
| *H03G 3/30* | (2006.01) |
| *H04B 1/713* | (2011.01) |

(52) U.S. Cl.
CPC ............ *H04B 1/16* (2013.01); *H03G 3/3068* (2013.01); *H03G 3/3078* (2013.01); *H04B 1/713* (2013.01)

(58) Field of Classification Search
CPC ......... H03G 3/3036; H04B 1/16; H04B 1/713

USPC .................................................... 455/234.1
See application file for complete search history.

(56) References Cited

U.S. PATENT DOCUMENTS

| | | |
|---|---|---|
| 6,487,240 B1 | 11/2002 | Chen |
| 6,642,797 B1 | 11/2003 | Luo et al. |
| 6,751,273 B1 | 6/2004 | Park et al. |
| 6,973,142 B2 | 12/2005 | Chen et al. |

(Continued)

FOREIGN PATENT DOCUMENTS

| | | |
|---|---|---|
| JP | 2006-109476 A | 4/2006 |
| JP | 4383445 B2 | 12/2009 |

(Continued)

*Primary Examiner* — Sanh Phu
(74) *Attorney, Agent, or Firm* — Mintz Levin Cohn Ferris Glovsky and Popeo, P.C.; Kongsik Kim; Colleen H. Witherell

(57) ABSTRACT

Disclosed herein are a Bluetooth signal receiving device and method. The Bluetooth signal receiving device includes an energy detector circuit, a radio frequency (RF) power detector circuit, an analog-digital converter circuit, and an automatic gain control circuit. The energy detector circuit detects a significant signal, having energy higher than background noise by a threshold value or more, from a received signal. The RF power detector circuit detects the magnitude of the received signal. The analog-digital converter circuit converts the analog value of the received signal into a digital value, and outputs the digital value. When the significant signal is detected, the automatic gain control circuit determines any one of predetermined coarse gain intervals to be a first coarse gain interval of the received signal by taking into account the magnitude of the received signal detected by the RF power detection circuit.

9 Claims, 7 Drawing Sheets

(56) References Cited

U.S. PATENT DOCUMENTS

| | | |
|---|---|---|
| 7,376,207 B2 | 5/2008 | Chen |
| 7,570,717 B2 | 8/2009 | Kim et al. |
| 7,639,762 B2 | 12/2009 | Weizhong |
| 7,664,205 B2 | 2/2010 | Wang et al. |
| 8,401,120 B1 | 3/2013 | Ozgur |
| 8,411,797 B2 | 4/2013 | Suissa et al. |
| 8,478,136 B2 | 7/2013 | Hayee et al. |
| 8,903,023 B1 | 12/2014 | Wang et al. |
| 2004/0242177 A1* | 12/2004 | Yang .................... H03G 3/3068 455/234.1 |
| 2013/0127529 A1* | 5/2013 | Morita ..................... H04B 1/30 330/124 R |
| 2013/0272722 A1 | 10/2013 | Hayee et al. |

FOREIGN PATENT DOCUMENTS

| | | |
|---|---|---|
| JP | 2011-166209 A | 8/2011 |
| JP | 5454181 B2 | 3/2014 |
| KR | 2001-0100573 A | 11/2001 |
| KR | 10-0339661 B1 | 5/2002 |
| KR | 10-0525002 B1 | 10/2005 |
| KR | 10-0544245 B1 | 1/2006 |
| KR | 2010-0035726 A | 4/2010 |
| KR | 10-1000861 B1 | 12/2010 |
| KR | 10-1026407 B1 | 4/2011 |

* cited by examiner

FIG. 7

| AGC Index | AGC Value | Magnitude of Received signal | Power detector |
|---|---|---|---|
| G0 | 75 | -100 ~ -75 | Weak electrical signal |
| G1 | 50 | -75 ~ -50 | Weak electrical signal |
| G2 | 25 | -50 ~ -25 | Strong electrical signal |
| G3 | 0 | -25 ~ 0 | Strong electrical signal |

BLUETOOTH SMART SIGNAL RECEIVING METHOD AND DEVICE USING IMPROVED AUTOMATIC GAIN CONTROL

CROSS-REFERENCE TO RELATED APPLICATION

This application claims under 35 U.S.C. §119(a) the benefit of Korean Patent Application No. 10-2015-0189370 filed on Dec. 30, 2015, which is incorporated herein by reference.

TECHNICAL FIELD

The present invention relates to technology for an automatic gain control method for a Bluetooth Smart signal receiving device and, more particularly, to an automatic gain control method and apparatus for a Bluetooth Smart receiver, which are capable of rapidly determining gain while dealing with a wide dynamic range.

The present invention was derived from the research conducted as a part of the Industrial Core Technology Development Project sponsored by the Korean Ministry of Trade, Industry and Energy and the Korea Institute of Industrial Technology Evaluation and Planning [Project Management Number: 100526269; Project Name: Development of BLE (Bluetooth Low-Energy) v4.2 Supporting Communication Semiconductor IP and

BACKGROUND ART

The configuration of a typical Bluetooth receiver is introduced in FIG. 1. Referring to FIG. 1, the Bluetooth receiver includes a front-end circuit 110 configured to obtain a baseband signal by demodulating a received signal, a filter 120 configured to selectively pass a desired channel therethrough and remove an undesired channel, and a recovery circuit 130 configured to convert the received baseband signal in the frequency domain into time domain symbols.

The front-end circuit 110 of the Bluetooth receiver obtains a baseband signal by controlling the magnitude of the received signal, and obtains samples by digitizing the obtained baseband signal. Since the magnitude of the received signal may vary over a wide range while passing through a wireless channel, the front-end circuit 110 attempts to maintain the magnitude of the baseband signal within an allowable range by performing automatic gain control (AGC). The automatic gain control may be performed in a manner that avoids the clipping of an analog-digital converter (ADC) that is used for the saturation of a receiver circuit and the digitization of a baseband signal.

FIG. 2 is a diagram showing a typical packet of Bluetooth Smart. Referring to FIG. 2, the packet of Bluetooth Smart includes a preamble interval 210, an access address interval 220, a protocol data unit (PDU) interval 230, and a CRC interval 240. Since a Bluetooth receiver must identify an address during the access address interval 220 and must identify and process data during the PDU interval 230, preparation for the identification of the address and the data must be completed during the preamble interval 210. Accordingly, there is a time limitation in that operations, such as automatic gain control, frequency offset compensation, timing compensation, etc., must be performed within a preamble interval of Bluetooth or Bluetooth Smart in the front-end circuit 110 of the Bluetooth receiver.

An example of preceding technology for rapidly performing automatic gain control during a preamble interval in a Bluetooth receiver is disclosed in U.S. Pat. No. 8,903,203 entitled "Adaptive Bluetooth Receiver and Method."

The preceding technology can perform compensation based on automatic gain control and DC offset calculation during a preamble interval having a setting similar to that of FIG. 2. The preceding technology performs primary automatic gain control in a fast Received Signal Strength Indicator (RSSI) detector, estimates a DC offset by calculating the DC average value of a preamble, and performs detailed automatic gain control in a slow RSSI detector.

The preceding technology can determine whether the result of the operation of the fast RSSI detector is larger than a threshold value THD in the primary automatic gain control process using the result of the operation of the fast RSSI detector, and then can increase or decrease gain. However, this operation requires the estimation of the range of strength of a signal at an initial step, and thus a disadvantage arises in that it is difficult to deal with a Bluetooth Smart signal in which the dynamic range of a received signal is about 100 dB.

That is, the preceding technology cannot perform sufficient automatic gain control for a Bluetooth Smart signal, in which the dynamic range thereof is about 100 dB, during a preamble interval, and thus there is a need for a means for overcoming this problem.

SUMMARY OF THE DISCLOSURE

The present invention is technology related to an automatic gain control (AGC) device and method for a Bluetooth Smart signal receiving device. An object of the present invention is to provide an automatic gain control device and method that perform automatic gain control in a Bluetooth Smart receiver, in which the dynamic range of a received signal is about 100 dB, while using a relatively small analog-to-digital converter (ADC) resolution and a relatively small dynamic range.

Recently standardized Bluetooth Smart has various application fields. Application fields, such as a smart remote control, require receiving sensitivity superior to existing receiving sensitivity, and also require the receiving of signals having a magnitude of about −100 dBm. Furthermore, wireless power transmission based on a magnetic resonance method, such as Alliance For Wireless Power (A4WP), has adopted Bluetooth Smart as a power control method. In this application field, the magnitude of the received signal is about 0 dBm.

In a Bluetooth Smart receiver that can deal with these various application fields, the implementation of a method for automatic gain control, in which a received signal ranges from −100 dBm to 0 dBm, requires the consideration of various applications of Bluetooth Smart that must minimize implementation costs by using the relatively small number of ADC bits (a relatively small resolution) and a relatively small dynamic range. Furthermore, this is a considerably difficult issue in view of the fact that the automatic gain control must be performed within the short preamble interval of Bluetooth Smart.

A typical AGC method is performed in such a manner as to sequentially increase or decrease an AGC gain value in accordance with the magnitude of a received signal, as in, for example, the above-described preceding technology of U.S. Pat. No. 8,903,203. This sequential AGC method is problematic in that as the range of a received signal increases and the number of ADC bits decreases, the convergence period of AGC increases.

For example, when the 100 dB range of a received signal is divided into four intervals (each of which has a range of 25 dB) based on the magnitude of the received signal and whether AGC has been converged is sequentially determined for the intervals, a maximum convergence period of 4 μs is required even when the time required for the determination of the convergence is 1 μs equally for the intervals. Furthermore, since the step of finely adjusting an AGC gain value must be additionally considered after the above approximate AGC convergence performed for each of the intervals, the time required for an AGC operation is considerably long. Since the length of the preamble interval of Bluetooth Smart is 8 μs and operations, such as frequency offset compensation, symbol timing estimation and packet detection, must be performed within the corresponding time in addition to AGC, it is difficult to apply a conventional AGC method of sequentially reducing an AGC gain value to a Bluetooth Smart receiver having a wide receiving range.

An object of the present invention is to propose an automatic gain control method that is capable of minimizing a convergence period while being operable for a signal of Bluetooth Smart in which the range of a received signal is about 100 dB.

An object of the present invention is to propose a method for reducing the complexity of implementation by using an ADC having a relatively small resolution in order to implement an automatic gain control device and method at low implementation costs.

There is a problem in that as the resolution of an ADC increases, the signal determination time of the ADC generally increases, costs generally increase, and the area of a circuit increases. Since a Bluetooth receiver requires not only the ADC but also various circuit modules, it is significantly important to the implementation of a Bluetooth receiver to reduce the area of the ADC, which is merely a module, and shorten the signal determination time.

An object of the present invention is to provide an automatic gain control technique that can minimize the operation and convergence period of AGC by using the output of an RF power detector and the output of the energy detector of a modem, thereby being capable of being applied to the wide range of a received signal while using a part of the narrow preamble interval of a packet of Bluetooth Smart.

An object of the present invention is to provide a method for improving the accuracy of automatic gain control via an automatic gain control tracking step in the access address interval of a packet of Bluetooth Smart.

According to an aspect of the present invention, there is provided a Bluetooth signal receiving device, including: an energy detector circuit configured to detect a significant signal, having energy higher than background noise by a threshold value or more, from a received signal; an radio frequency (RF) power detector circuit configured to detect the magnitude of the received signal; an analog-digital converter circuit configured to convert the analog value of the received signal into a digital value and output the digital value; and an automatic gain control circuit configured to, when the significant signal is detected, determine any one of predetermined coarse gain intervals to be a first coarse gain interval of the received signal by taking into account the magnitude of the received signal detected by the RF power detection circuit.

The automatic gain control circuit may be further configured to determine any one of the predetermined coarse gain intervals to be a second coarse gain interval of the received signal by detecting whether the first coarse gain interval and the output of the analog-digital converter circuit have been saturated.

The automatic gain control circuit may be further configured to assign a predetermined fixed gain value to each of the predetermined coarse gain intervals. In this case, the automatic gain control circuit may be further configured to determine a gain value, at which the highest signal magnitude value of each of the predetermined coarse gain intervals saturates the analog-digital converter circuit, to be the fixed gain value of each of the coarse gain intervals.

The analog-digital converter may be further configured to have a resolution into which a dynamic range of the predetermined coarse gain intervals and the threshold value of the energy detector circuit have been incorporated.

The automatic gain control circuit may be further configured to determine the first coarse gain interval and the second coarse gain interval during a preamble interval of a Bluetooth signal.

The automatic gain control circuit may be further configured to track the gain of the received signal by comparing the output of the energy detector circuit with the target value of automatic gain control during an access address interval of a Bluetooth signal.

According to another aspect of the present invention, there is provided a Bluetooth signal receiving method, including: detecting a significant signal, having energy higher than background noise by a threshold value or more, from a received signal; detecting the magnitude of the received signal; converting the analog value of the received signal into a digital value, and outputting the digital value; and when the significant signal is detected, determining any one of predetermined coarse gain intervals to be a first coarse gain interval of the received signal by taking into account the detected magnitude of the received signal.

The Bluetooth signal receiving method may further include determining any one of the predetermined coarse gain intervals to be a second coarse gain interval of the received signal by detecting whether the first coarse gain interval and the output of the analog-digital converter circuit have been saturated.

The Bluetooth signal receiving method may further include determining a gain value, at which the highest signal magnitude value of each of the predetermined coarse gain intervals saturates the digital value of the received signal, to be a fixed gain value of each of the coarse gain intervals.

The first coarse gain interval and the second coarse gain interval may be determined during a preamble interval of a Bluetooth signal.

The Bluetooth signal receiving method may further include tracking the gain of the received signal by comparing the digital value of the received signal with the target value of automatic gain control during an access address interval of a Bluetooth signal.

BRIEF DESCRIPTION OF THE DRAWINGS

The above and other objects, features and advantages of the present invention will be more clearly understood from the following detailed description taken in conjunction with the accompanying drawings, in which:

FIG. 7 is a diagram showing a process of determining a coarse gain interval in a Bluetooth signal receiving device according to an embodiment of the present invention.

DETAILED DESCRIPTION OF THE DISCLOSURE

Embodiments of the present invention will be described in detail with reference to the accompanying drawings. In the following description of the present invention, a detailed description of a related well-known component or function will be omitted when it is determined that the detailed description may make the gist of the present invention obscure.

The prevent invention is not limited to the embodiments. Throughout the accompanying drawings, the same reference symbols designate the same components.

Figure 1:
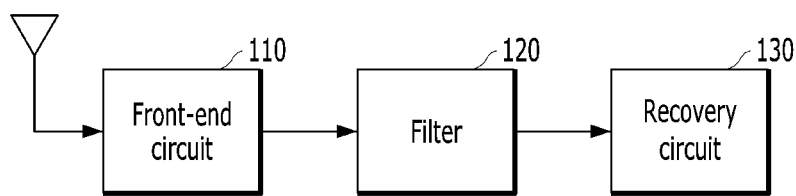
FIG. 1 is a block diagram showing the configuration of a typical Bluetooth receiver.
Figure 2:
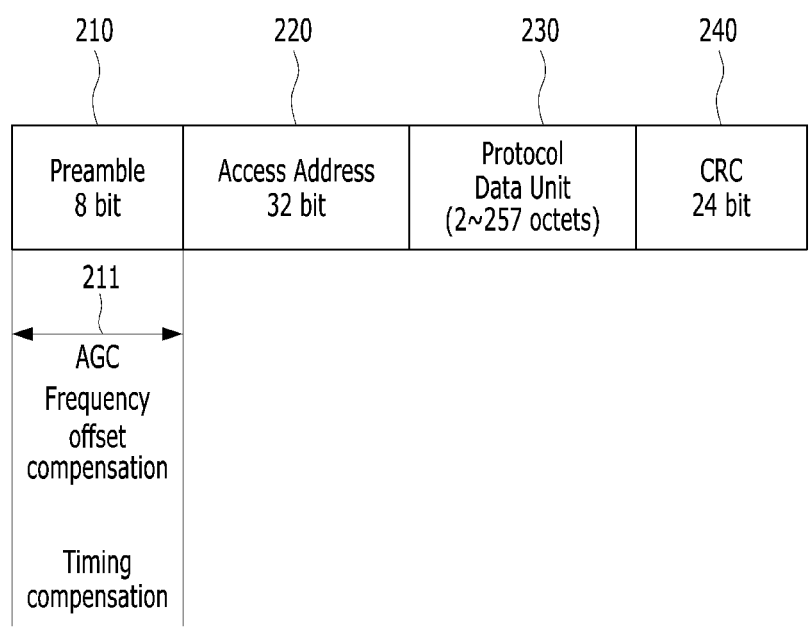
FIG. 2 is a diagram showing a typical packet of Bluetooth Smart.
Figure 3:
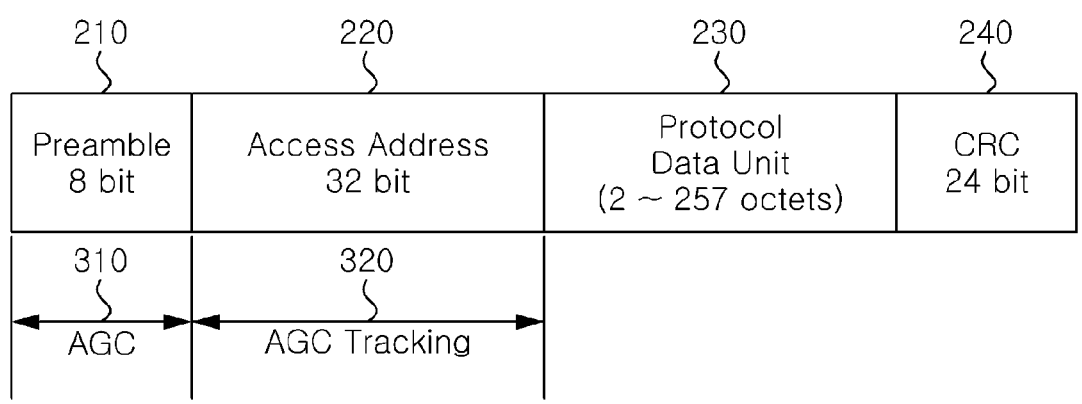
FIG. 3 is a diagram showing an automatic gain control operation, performed in a Bluetooth signal receiving device according to an embodiment of the present invention, in connection with a packet of Bluetooth Smart.

FIG. 3 is a diagram showing an automatic gain control operation, performed in a Bluetooth signal receiving device according to an embodiment of the present invention, in connection with a packet of Bluetooth Smart. One bit of a packet of Bluetooth Smart corresponds to a time interval of 1 μs.

Referring to FIG. 3, a packet of Bluetooth Smart includes an 8-us preamble interval 210 and a 32-us access address interval 220. The Bluetooth signal receiving device of the present invention performs an AGC operation 310 including a coarse AGC step and a fine AGC step during a 8-us preamble interval 210, and performs an AGC tracking operation 320 during a 32-us access address interval 220.

Since the preamble interval 210 is a period that is not sufficient to perform all the AGC operation 310 for a received signal with a wide dynamic range, the Bluetooth signal receiving device of the present invention performs a reduced AGC operation 310 for the wide dynamic range via the following configuration and operation.

Figure 4:
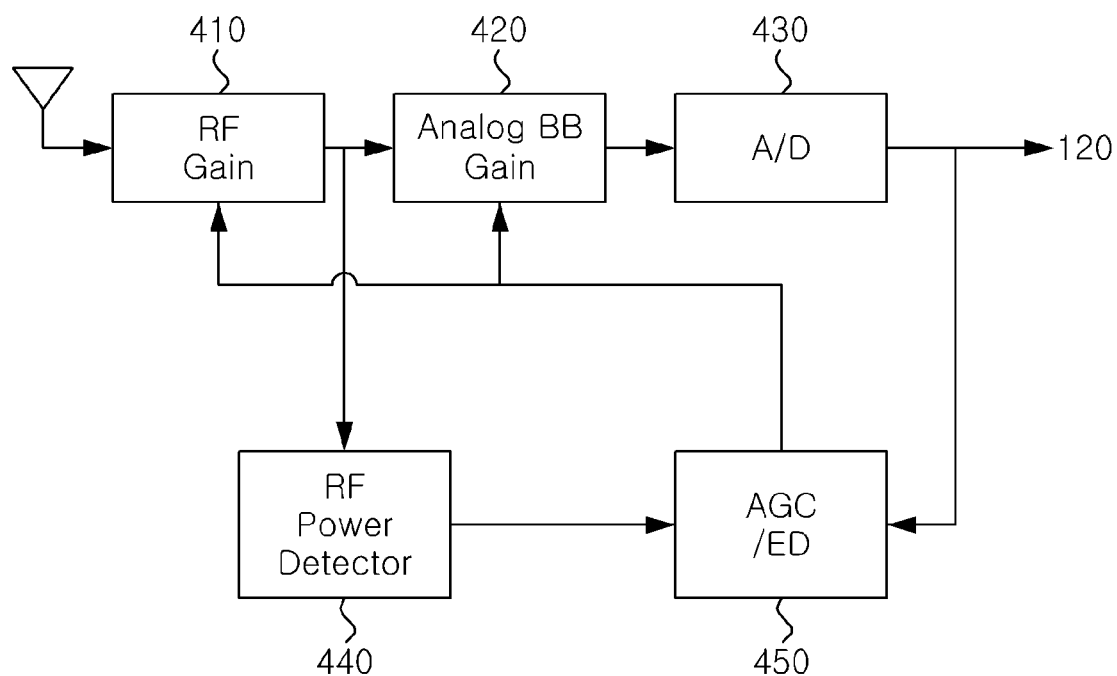
FIG. 4 is a diagram showing a part of the front-end circuit of a Bluetooth signal receiving device according to an embodiment of the present invention.

FIG. 4 is a diagram showing a part of the front-end circuit of a Bluetooth signal receiving device according to an embodiment of the present invention.

The Bluetooth signal receiving device includes an RF gain circuit 410, an analog baseband signal gain circuit 420, an analog-digital converter circuit 430, an RF power detector circuit 440, and an automatic gain control/energy detector circuit 450.

Although the automatic gain control/energy detector circuit 450 is illustrated as performing both an automatic gain control operation and an energy detection operation in FIG. 4, an automatic gain control circuit and an energy detector circuit may be designed to be separate in another embodiment of the present invention.

The operation of the RF power detector circuit 440 and the energy detection operation of the automatic gain control/energy detector circuit 450 are not necessarily performed sequentially, but the energy detection operation of the automatic gain control/energy detector circuit 450 may be performed while the operation of the RF power detector circuit 440 is being performed. Since the operation of the RF power detector circuit 440 and the energy detection operation of the automatic gain control/energy detector circuit 450 may be performed simultaneously, this can contribute to a reduction in a convergence period required for the coarse AGC operation of the Bluetooth signal receiving device and the determination of a first coarse gain interval.

The automatic gain control/energy detector circuit 450 detects a significant signal, having energy higher than background noise by a threshold value or more, from the received signal. Assuming that the noise index of a receiver is 5 dB, the magnitude of background noise may be calculated as −109 dBm (=−174+10*log 10(1 MHz)+5) in the receiver. In this case, when a Bluetooth Smart signal having a magnitude equal to or higher than −100 dBm is received, the magnitude of background noise is −109 dBm, and thus SNR becomes equal to or higher than 9 dB. Accordingly, the energy detector can easily determine whether a significant received signal is present. The time required for the automatic gain control/energy detector circuit 450 to determine whether a significant signal is present is about 1 μs. In this case, when the SNR required for the automatic gain control/energy detector circuit 450 to determine whether a significant signal is present is 9 dB, the threshold value may be set to 9 dB.

The RF power detector circuit 440 detects the magnitude of the received signal. The RF power detector circuit 440 may be viewed as a type of typical RSSI detector circuit.

When it is determined that a significant signal has been detected via the energy detection operation, the automatic gain control/energy detector circuit 450 determines any one of predetermined coarse gain intervals to be the first coarse gain interval of the received signal by taking into account the magnitude of the received signal detected by the RF power detector circuit 440. The process of determining the first coarse gain interval forms one step of coarse AGC. The coarse gain intervals will be described with reference to FIG. 7.

FIG. 7 is a diagram showing a process of determining a coarse gain interval in a Bluetooth signal receiving device according to an embodiment of the present invention. FIG. 7 shows coarse gain intervals when it is assumed that the maximum value of the input of the analog-digital converter circuit 430 is 0 dBm in the embodiment of the present invention.

Referring to FIG. 7, an example of coarse gain intervals including four intervals is introduced. The coarse gain intervals are referred to as indices G0, G1, G2 and G3, respectively, for ease of description. The magnitude of the received signal refers to the dynamic range of the coarse gain intervals, and an AGC value refers to the representative fixed gain value of each of the coarse gain intervals. In view of the fact that as the received signal corresponding to each of the intervals increases, the AGC gain decreases, the AGC values of the respective intervals G0, G1, G2 and G3 of FIG. 7 have the relationship of AGC value G0>AGC value G1>AGC value G2>AGC value G3.

The operation of the Bluetooth signal receiving device of the present invention will be described with reference to FIGS. 4 and 7 below. Such a representative fixed gain value (an AGC value) is selected as a boundary point at which the largest value in the range of the received signal of each of the coarse gain intervals G0, G1, G2 and G3 does not saturate/saturates the input of the analog-digital converter circuit 430. That is, since in the interval G0, the magnitude of the received signal ranges from −100 to −75 dB and the maximum value of ADC input is 0 dBm, a boundary point at which saturation is not performed/is performed is 75 dB. Accordingly, the AGC value of the interval G0 may be set to 75 dB. In the same manner, the AGC value of the interval G1 may be set to 50 dB, the AGC value of the interval G2 may be set to 25 dB, and the AGC value of the interval G3 may be set to 0 dB.

When the operation of the receiver starts, the energy detector circuit 450 of a modem is operated in the state in which the AGC gain values of the RF gain circuit 410 and the analog baseband signal gain circuit 420 are set to the initial value G0 (=75 dB) of the coarse AGC step. The time required for the automatic gain control/energy detector circuit 450 to determine whether a significant signal having energy, higher than background noise by a threshold value (a minimum SNR required for the detection of energy), is present is 1 µs, as described above.

After the presence of the significant received signal has been detected by the automatic gain control/energy detector circuit 450, the automatic gain control/energy detector circuit 450 detects the output of the RF power detector circuit 440, maintains the AGC gain value at G0 (=75 dB) without change when the received signal is a Weak Electrical signal (the magnitude of the received signal <-50 dBm), and reduces the AGC gain value to G2 (=25 dB) when the received signal is a Strong Electrical signal (the magnitude of the received signal >-50 dBm). That is, the Bluetooth signal receiving device of the present invention can efficiently deal with a wide dynamic range in such a way as to maintain the AGC gain at a high value when a significant received signal is detected but the magnitude of the received signal is not sufficiently high and in such a way as to reduce the AGC gain when a significant received signal is detected and the magnitude of the received signal is sufficiently high. The time required for the RF power detector circuit 440 to determine whether the received signal is a Weak Electrical signal or a Strong Electrical signal is about 1 µs. In this case, the operation of the automatic gain control/energy detector circuit 450 and the operation of the RF power detector circuit 440 may be performed simultaneously.

The first step of the coarse AGC that is determined as a result of the operation of the automatic gain control/energy detector circuit 450 and the operation of the RF power detector circuit 440 may be viewed as determining the first coarse interval to be any one of G0 or G2 that the received signal has.

Thereafter, the automatic gain control/energy detector circuit 450 determines that the analog-digital converter circuit 430 has been saturated with the current AGC gain at the second step of the coarse AGC when the frequency at which the output signal of the analog-digital converter circuit 430 has the maximum value that the analog-digital converter circuit 430 can have is higher than a predetermined level during a predetermined period, and additionally reduces the AGC gain value. Since the saturation of the analog-digital converter circuit 430 means that the received signal having passed through the RF gain circuit 410 and the analog baseband signal gain circuit 420 is high above the input range of the analog-digital converter circuit 430, and thus it is necessary to additionally reduce the AGC gain value.

When the received signal is a Weak Electrical signal and the saturation of the analog-digital converter circuit 430 has occurred, the AGC gain value is reduced to G1 (=50 dB). In contrast, when the received signal is a Strong Electrical signal and the saturation of the analog-digital converter circuit 430 has occurred, the AGC gain value is reduced to G3 (=0 dB). The time required for the analog-digital converter circuit 430 to determine whether the output signal has been saturated is about 1 µs. After the second step of the coarse AGC has been performed in the above-described manner, the AGC gain value has one value of G0, G1, G2 and G3 depending on the range of the received signal. In this case, the determined AGC gain value corresponds to any one of the coarse gain intervals G0, G1, G2 and G3. The Bluetooth signal receiving device of the present invention may determine a coarse gain interval corresponding to the determined AGC gain value to be the second coarse gain interval that the received signal has.

Thereafter, a fine AGC step is performed. The automatic gain control/energy detector circuit 450 may adjust the received signal to a value close to the target value of the AGC at the fine AGC step. The time required for the automatic gain control/energy detector circuit 450 to perform the fine AGC step is about 1 µs. The operation of the fine AGC step that is performed by the automatic gain control/energy detector circuit 450 is performed by using a method of comparing the output of the automatic gain control/energy detector circuit 450 with the target value of the AGC.

The operations of the above-described coarse AGC step and fine AGC step may be performed in the first 4-µs period of the preamble interval 210 of Bluetooth Smart by the automatic gain control/energy detector circuit 450.

Furthermore, the automatic gain control/energy detector circuit 450 additionally performs the AGC tracking step 320 during the access address interval 220, thereby increasing the accuracy of AGC. The AGC tracking step is also performed by using a method of comparing the output of the automatic gain control/energy detector circuit 450 with the target value of AGC.

The resolution of the analog-digital converter circuit 430 may be a resolution into which the dynamic range of the predetermined coarse gain interval and the threshold SNR of the energy detection operation have been incorporated. For AGC to be performed with an overall received signal range divided into four intervals G0, G1, G2 and G3, the number of required bits of the resolution of the analog-digital converter circuit 430 is calculated as follows. When the overall 100-dB target range of the received signal is divided into four intervals G0, G1, G2 and G3, the range of each of the intervals becomes 25 dB. When the SNR required for energy detection in each of the intervals is 9 dB, an SNR of 34 dB must be ensured in order to enable energy detection and signal receiving without saturation at a fixed AGC gain value in each of the intervals, and thus the number of required ADC bits must be 6 or more bits.

Figure 5:
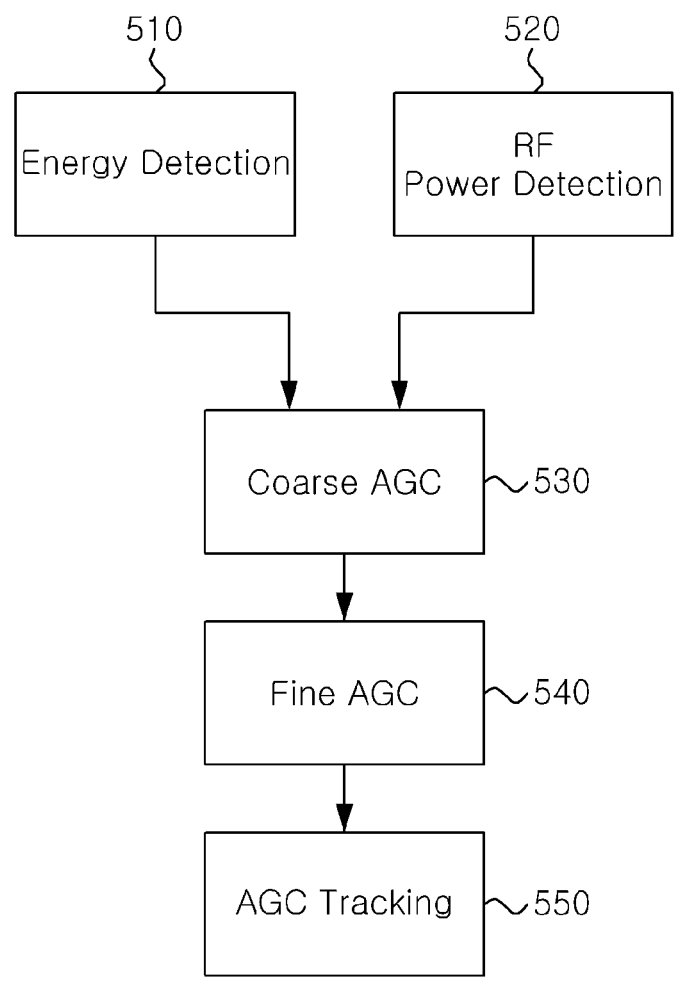
FIG. 5 is an operation flowchart showing the operation sequence of a Bluetooth signal receiving method according to an embodiment of the present invention.

FIG. 5 is an operation flowchart showing the operation sequence of a Bluetooth signal receiving method according to an embodiment of the present invention.

Referring to FIG. 5, the Bluetooth signal receiving method includes step of 510 of detecting a significant signal, having energy higher than background noise by a threshold value or more, from a received signal.

The Bluetooth signal receiving method further includes step 520 of detecting the magnitude of the RF power of the received signal.

The Bluetooth signal receiving method further includes step 530 of, when a significant signal has been detected, determining any one of predetermined coarse gain intervals G0 and G2 to be the first coarse gain interval of the received signal by taking into account the detected magnitude of the received signal, and determining any one of predetermined coarse gain intervals G0, G1, G2 and G3 to be the second coarse gain interval of the received signal by detecting whether the first coarse gain interval and the received signal have been saturated with the digital value (obtained by monitoring the ADC output) of the received signal. This process may be viewed as a coarse AGC process.

The Bluetooth signal receiving method includes fine AGC step 540 of adjusting the received signal to a value close to the target value of AGC.

The Bluetooth signal receiving method further includes AGC tracking step 550 performed during the access address interval 220, thereby increasing the accuracy of AGC.

Figure 6:
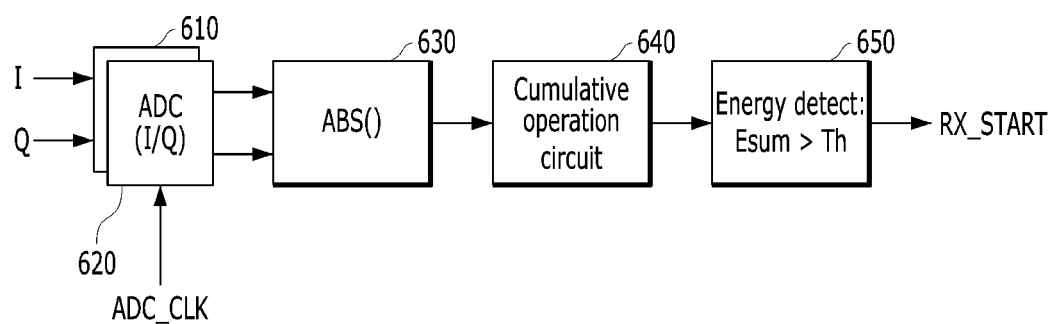
FIG. 6 is a diagram showing an energy detector circuit according to an embodiment of the present invention.

FIG. 6 is a diagram showing an energy detector circuit according to an embodiment of the present invention.

Referring to FIG. 6, there is shown a pair of ADCs 610 and 620 configured to receive an I signal and a Q signal, respectively, and convert analog values into digital values. The outputs of the pair of ADCs 610 and 620 are converted into absolute values by an absolute value circuit 630, and are accumulated during one symbol interval by a cumulative operation circuit 640. The energy detector circuit 650 may determine whether a significant signal is present by comparing the absolute value Esum of the received signal, accumulated during the one symbol interval by the cumulative operation circuit 640, with a threshold value Th. When it is determined by the energy detector circuit 650 that a significant signal is present, an RX_START signal may be generated, and a notification adapted to allow the RF power detector circuit 440 to operate may be provided.

The Bluetooth signal receiving method according to the embodiment of the present invention may be implemented in the form of program instructions that can be executed by a variety of computer means, and may be stored in a computer-readable storage medium. The computer-readable storage medium may include program instructions, a data file, and a data structure solely or in combination. The program instructions that are stored in the medium may be designed and constructed particularly for the present invention, or may be known and available to those skilled in the field of computer software. Examples of the computer-readable storage medium include magnetic media such as a hard disk, a floppy disk and a magnetic tape, optical media such as CD-ROM and a DVD, magneto-optical media such as a floptical disk, and hardware devices particularly configured to store and execute program instructions such as ROM, RAM, and flash memory. Examples of the program instructions include not only machine language code that is constructed by a compiler but also high-level language code that can be executed by a computer using an interpreter or the like. The above-described hardware components may be configured to act as one or more software modules that perform the operation of the present invention, and vice versa.

According to the present invention, a Bluetooth Smart receiver in which the dynamic range of a received signal is about 100 dB can be constructed.

According to the present invention, the range of a received signal can be divided into N (for example, 4 or 8), and the operation time of a coarse AGC step can be minimized by using both the output of the RF power detector and the output of the energy detector of the modem.

According to the present invention, a coarse AGC step and a fine AGC step are performed by using a preamble interval of Bluetooth Smart, and an AGC tracking step is performed by using an access address interval of Bluetooth Smart, thereby improving the accuracy of AGC.

According to the present invention, the dynamic range target (for example, 100 dB) of a received signal can be set, and the overall dynamic range target of the received signal can be divided into a plurality of coarse gain intervals by taking account into the trade-off between the resolution of the required ADC circuit and the threshold value (an SNR value at which a significant signal can be detected) of the energy detection circuit.

Accordingly, according to the present invention, even when a received signal varies in a wide dynamic range, any one of coarse gain intervals can be determined at an early stage, and then an AGC operation can be performed, thereby achieving the effect of rapidly determining automatic gain during a preamble interval.

According to the present invention, the operation of the RF power detector circuit and the operation of the energy detector circuit can be performed simultaneously, and a coarse gain interval to which a received signal belongs can be rapidly determined. Furthermore, division into a plurality of coarse gain intervals is performed and a signal is recovered within each coarse gain interval, thereby reducing the resolution of the ADC circuit.

While the present invention has been described in conjunction with specific details, such as specific elements, and limited embodiments and diagrams, above, these are provided merely to help an overall understanding of the present invention. The present invention is not limited to these embodiments, and various modifications and variations can be made based on the foregoing description by those having ordinary knowledge in the art to which the present invention pertains.

Therefore, the technical spirit of the present invention should not be determined based only on the described embodiments, and not only the following claims but also all equivalents to the claims and equivalent modifications should be construed as falling within the scope of the spirit of the present invention.

What is claimed is:

1. A signal receiving device, comprising:
    an energy detector circuit configured to detect a significant signal, having energy higher than background noise by a threshold value or more, from a received signal;
    an radio frequency (RF) power detector circuit configured to detect a magnitude of the received signal when the energy detector circuit detects the significant signal;
    an analog-digital converter circuit configured to:
        convert an analog value of the received signal into a digital value; and
        output the digital value; and
    an automatic gain control circuit configured to:
        when the significant signal is detected, determine any one of predetermined coarse gain intervals as a first coarse gain interval of the received signal by taking into account the magnitude of the received signal detected by the RF power detection circuit when the energy detector circuit detects the significant signal;
        assign a predetermined fixed gain value to each of the predetermined coarse gain intervals; and
        determine a gain value, at which a highest signal magnitude value of each of the predetermined coarse gain intervals saturates the digital value of the received signal used in the analog-digital converter circuit, to be the fixed gain value of each of the coarse gain intervals.

2. The signal receiving device of claim 1, wherein the automatic gain control circuit is further configured to determine any one of the predetermined coarse gain intervals as a second coarse gain interval of the received signal by detecting whether the first coarse gain interval and the output of the analog-digital converter circuit have been saturated.

3. The signal receiving device of claim 1, wherein the analog-digital converter is further configured to have a resolution into which a dynamic range of the predetermined coarse gain intervals and the threshold value of the energy detector circuit have been incorporated.

4. The signal receiving device of claim 1, wherein the automatic gain control circuit is further configured to determine the first coarse gain interval during a preamble interval of the received signal.

5. The signal receiving device of claim 1, wherein the automatic gain control circuit is further configured to track a gain of the received signal by comparing output of the energy detector circuit with a target value of automatic gain control during an access address interval of the received signal.

6. A signal receiving method, comprising:
    detecting a significant signal, having energy higher than background noise by a threshold value or more, from a received signal;
    detecting a magnitude of the received signal;
    converting an analog value of the received signal into a digital value, and outputting the digital value;
    when the significant signal is detected, determining any one of predetermined coarse gain intervals as a first coarse gain interval of the received signal by taking into account the detected magnitude of the received signal; and
    determining a gain value, at which a highest signal magnitude value of each of the predetermined coarse gain intervals saturates the digital value of the received signal, to be a fixed gain value of each of the coarse gain intervals.

7. The signal receiving method of claim 6, further comprising determining any one of the predetermined coarse gain intervals as a second coarse gain interval of the received signal by detecting whether the first coarse gain interval and the output of the analog-digital converter circuit have been saturated.

8. The signal receiving method of claim 6, wherein the determining is performed during a preamble interval of the received signal.

9. The signal receiving method of claim 6, further comprising tracking a gain of the received signal by comparing the digital value of the received signal with a target value of automatic gain control during an access address interval of the received signal.

* * * * *